(12) United States Patent
Lindfors

(10) Patent No.: US 7,105,054 B2
(45) Date of Patent: *Sep. 12, 2006

(54) METHOD AND APPARATUS OF GROWING A THIN FILM ONTO A SUBSTRATE

(75) Inventor: Sven Lindfors, Espoo (FI)

(73) Assignee: ASM International N.V., Bilthoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/836,674

(22) Filed: Apr. 16, 2001

(65) Prior Publication Data

US 2002/0108570 A1 Aug. 15, 2002

(30) Foreign Application Priority Data

Apr. 14, 2000 (FI) .................................. 20000899

(51) Int. Cl.
C30B 25/00 (2006.01)
C30B 25/08 (2006.01)

(52) U.S. Cl. .............................. 117/84; 117/88; 117/89; 117/93; 117/102

(58) Field of Classification Search .................. 117/84, 117/88, 89, 93, 102
See application file for complete search history.

(56) References Cited

U.S. PATENT DOCUMENTS

| | | | |
|---|---|---|---|
| 4,058,430 A | | 11/1977 | Suntola et al. |
| 4,389,973 A | | 6/1983 | Suntola et al. |
| 4,413,022 A | * | 11/1983 | Suntola et al. ................ 117/89 |
| 4,780,174 A | * | 10/1988 | Lan et al. .................... 117/101 |
| 4,840,921 A | * | 6/1989 | Matsumoto .................. 117/102 |
| 4,940,213 A | | 7/1990 | Ohmine et al. |
| 5,102,637 A | | 4/1992 | Snyder et al. |
| 5,114,683 A | | 5/1992 | Hirase |
| 5,166,092 A | * | 11/1992 | Mochizuki et al. ......... 117/102 |
| 5,300,186 A | * | 4/1994 | Kitahara et al. ............ 117/105 |
| 5,316,793 A | * | 5/1994 | Wallace et al. ............... 118/50 |

(Continued)

FOREIGN PATENT DOCUMENTS

EP 0 823 279 A2 2/1998

(Continued)

OTHER PUBLICATIONS

Niinisto et al., "ALD precursor chemistry: evolution and future challenges," Journal de Physsique IV. vol. 9 (1999), pp. Pr8-837-Pr8-852.

(Continued)

Primary Examiner—Robert Kunemund
Assistant Examiner—Matthew J. Song
(74) Attorney, Agent, or Firm—Knobbe, Martens, Olson & Bear, LLP.

(57) ABSTRACT

A method and an apparatus for growing a thin film onto a substrate by the ALD process. The apparatus comprises a reaction chamber into which the substrate can be disposed; a plurality of inlet channels communicating with said reaction chamber, said inlet channels being suited for feeding the reactants employed in a thin-film growth process in the form of vapor-phase pulses into said reaction chamber; at least one outlet channel communicating with said reaction chamber, said outlet channel being suited for the outflow of reaction products and excess amounts of reactants from said reaction space; and a pre-reaction chamber arranged immediately upstream of the reaction chamber, said pre-reaction chamber forming a first reaction zone, in which the reactants of successive vapor-phase pulses can be reacted with each other in the vapor phase to form a solid product, whereas said reaction chamber forming a second reaction zone can be operated under conditions conducive to ALD growth of a thin film.

20 Claims, 2 Drawing Sheets

U.S. PATENT DOCUMENTS

| | | |
|---|---|---|
| 5,417,934 A | 5/1995 | Smith et al. |
| 5,601,651 A | 2/1997 | Watabe |
| 5,688,479 A | 11/1997 | Chao |
| 5,819,683 A | 10/1998 | Ikeda et al. |
| 5,855,675 A | 1/1999 | Doering et al. |
| 5,855,680 A * | 1/1999 | Soininen et al. ............ 118/719 |
| 5,928,426 A | 7/1999 | Aitchison |
| 6,015,590 A * | 1/2000 | Suntola et al. ............. 117/102 |
| 6,063,197 A | 5/2000 | Cox et al. |
| 6,093,253 A * | 7/2000 | Lofgren et al. ............. 118/725 |
| 6,099,649 A | 8/2000 | Schmitt et al. |
| 6,193,802 B1 | 2/2001 | Pang et al. |
| 6,197,119 B1 | 3/2001 | Dozoretz et al. |
| 6,200,893 B1 | 3/2001 | Sneh |
| 6,223,684 B1 | 5/2001 | Fujioka et al. |
| 6,238,514 B1 | 5/2001 | Gu |
| 6,305,314 B1 * | 10/2001 | Sneh et al. ............... 118/723 E |
| 6,306,216 B1 | 10/2001 | Kim et al. |
| 6,506,352 B1 * | 1/2003 | Lindfors et al. ......... 423/240 S |
| 6,770,145 B1 | 8/2004 | Saito |
| 2001/0000866 A1 | 5/2001 | Sneh et al. |

FOREIGN PATENT DOCUMENTS

| | | |
|---|---|---|
| FI | 84980 | 11/1991 |
| WO | WO 99/23686 | 7/1999 |
| WO | WO 9951797 A1 * | 10/1999 |

OTHER PUBLICATIONS

M. Leskela et al., "Synthesis of oxide thin films and overlayers by atomic layer epitaxy for advanced applications," Materials Science & Engineering, vol. B41 (1996), pp. 23-29.

Tuomo Suntola, "Atomic layer epitaxy," Thin Solid Films, vol. 216 (1992), pp. 84-89.

* cited by examiner

METHOD AND APPARATUS OF GROWING A THIN FILM ONTO A SUBSTRATE

BACKGROUND OF THE INVENTION

1. Field of the Invention

The present invention relates to the production of thin films. In particular, the invention concerns a method of growing a thin film onto a substrate, in which method the substrate is placed in a reaction chamber and it is subjected to surface reactions of a plurality of vapour-phase reactants according to the ALD method to form a thin film. The invention also concerns apparatus for implementing the method.

2. Description of Related Art

Conventionally, thin films are grown out using vacuum evaporation deposition, Molecular Beam Epitaxy (MBE) and other similar vacuum deposition techniques, different variants of Chemical Vapor Deposition (CVD) (including low-pressure and metallo-organic CVD and plasma-enhanced CVD) or, alternatively, the above-mentioned deposition process based on alternate surface reactions, known in the art as the Atomic Layer Deposition, in the following abbreviated ALD, formerly also called Atomic Layer Epitaxy or "ALE". Equipment for the ALD process is supplied under the name ALCVD™ by ASM Microchemistry Oy, Espoo, Finland. In the MBE and CVD processes, besides other variables, the thin film growth rate is also affected by the concentrations of the starting material inflows. To achieve a uniform surface smoothness of the thin films manufactured using these methods, the concentrations and reactivities of the starting materials must be kept equal on one side of the substrate. If the different starting materials are allowed to mix with each other prior to reaching the substrate surface as is the case in the CVD method, the possibility of mutual reactions between the reagents is always imminent. Herein arises a risk of microparticle formation already in the infeed lines of the gaseous reactants. Such microparticles generally have a deteriorating effect on the quality of the deposited thin film. However, the occurrence of premature reactions in MBE and CVD reactors can be avoided, e.g., by heating the reactants not earlier than only at the substrates. In addition to heating, the desired reaction can be initiated with the help of, e.g., plasma or other similar activating means.

In MBE and CVD processes, the growth rate of thin films is primarily adjusted by controlling the inflow rates of starting materials impinging on the substrate. By contrast, the thin film growth rate in the ALD process is controlled by the substrate surface properties, rather than by the concentrations or other qualities of the starting material inflows. In the ALD process, the only prerequisite is that the starting material is provided in a sufficient concentration for film growth on the substrate.

The ALD method is described, e.g., in FI Patents Nos. 52,359 and 57,975 as well as in U.S. Pat. Nos. 4,058,430 and 4,389,973. Also in FI Patents Nos. 97,730, 97,731 and 100,409 are disclosed some apparatus constructions suited for implementing the method. Equipment for thin film deposition are further described in publications Material Science Report 4(7), 1989, p. 261, and Tyhjiötekniikka (title in English: Vacuum Techniques), ISBN 951-794-422-5, pp. 253–261.

In the ALD method, atoms or molecules sweep over the substrates thus continuously impinging on their surface so that a fully saturated molecular layer is formed thereon. Thus, typically, an ALD method comprises the steps of:

feeding vapour-phase reactants into an reaction chamber in the form of vapour-phase pulses repeatedly and alternately; and causing said vapour-phase reactants to react with the surface of the substrate to form a thin film compound on the substrate.

According to the conventional techniques known from FI Patent Specification No. 57,975, the saturation step is followed by a protective gas pulse forming a diffusion barrier that sweeps away the excess starting material and the gaseous reaction products from the substrate. The successive pulses of different starting materials and the protective gas pulses forming diffusion barriers that separate the successive starting materials pulses from each other accomplish the growth of the thin film at a rate controlled by the surface chemistry properties of the different materials. To the function of the process it is irrelevant whether they are the gases or the substrates that are kept in motion, but rather, it is imperative that the different starting materials of the successive reaction steps are separated from each other and arranged to impinge on the substrate alternately.

Even if the above-described arrangement is rather reliable, it has some disadvantages. For instance, the cross sections and shapes of piping in practical reactor constructions vary between, e.g., the inlet manifold and the substrates, whereby the thickness and shape of the diffusion barrier become difficult to control and the starting materials may become carried over into contact with each other. The diffusion wall may also become destroyed in the nozzles feeding the vapor-phase reactant to the substrates, in gas mixers or at other discontinuity points of the piping. The laminarity of gas inflow may also become disturbed by a too tight bend in the piping.

Intermixing of starting materials in flow systems cannot be prevented simply by keeping the gas volumes apart from each other, because mixing may also occur due to adherence of molecules from a starting material pulse on the apparatus walls or discontinuities thereof, wherefrom the molecules may then gain access with the molecules of the successive starting material pulse.

As a solution to the above problems we have earlier designed an ALD process and apparatus wherein each starting material pulse is individually driven through the piping and reaction space of the apparatus isolated from the other pulses (U.S. Pat. No. 6,015,590). According to that invention, the gas volume of the reaction space is purged between two successive vapor-phase pulses essentially entirely, which means a purging efficiency of at least 99%, advantageously 99.99%. All the reacting gas, in practice the entire gas volume filled with the vapor-phase reactant, is purged from the reaction chamber between the successive pulses. Thus, the reactant pulses of different starting materials remain isolated from each other, whereby no mixing of the reactants can occur.

The above-mentioned process is quite efficient. However, there still exists a need of alternative solutions to the intermixing problem. This relates to situations in which the purging/evacuation process is not available or when it is desired further to reduce the concentration of the residues of the previous pulse before feeding the following one into the reaction chamber.

SUMMARY OF THE INVENTION

It is an object of the present invention to provide a novel method of reducing the concentration of vapour phase reactant residues in an ALD process.

It is another object of the present invention to provide a novel apparatus for implementing such a process.

These and other objectives, together with the advantages thereof over known processes and apparatuses which shall become apparent from the following specification, are accomplished by the invention as hereinafter described and claimed.

Generally, the present invention is based on the idea of subjecting the residual components of the previous vapour-phase pulse to a chemical reaction in order to convert said residues into a reaction product which does not interfer with the ALD growth of a thin film on the substrate placed in the reaction chamber. In particular, the invention aims at producing a solid reaction product which can be separately removed from the reactor equipment. Preferably, a part of the reactant molecules of the subsequent vapour-phase pulse are sacrificed and used for chemically depleting the residual concentration of the previous vapour-phase pulse. Thus, according to the present invention a subsequent vapour-phase pulse is contacted with the residual components of the previous vapour-phase pulse so as to form a reaction product of the reactant of the subsequent vapour-phase pulse with the reactant of the previous vapour-phase pulse before feeding the subsequent vapour-phase pulse into the reaction chamber.

The apparatus according to the present invention comprises immediately upstream of the reaction chamber a pre-reaction zone, in which the reactants of successive vapour-phase pulses can be reacted with each other in the vapour phase to form a solid product. The pre-reaction zone is preferably operated under conditions conducive to CVD growth of a reaction product between the subsequent vapour-phase pulses, whereas said reaction chamber which forms a second reaction zone is operated under conditions conducive to ALD growth of a thin film.

More specifically, the method according to the present invention is characterized by what is stated in the characterizing part of claim 1.

The apparatus according to the present invention is characterized by what is stated in the characterizing part of claim 17.

Considerable advantages are obtained by means of the invention. Thus, the present process provides an efficient and simple way of significantly reducing or, for practical purposes, even entirely eliminating the tail of the previous reactant pulse which causes uneven thin film growth. The use of a pre-reaction space for eliminating said tail improves uniformity of the film due to chemical purge of precursor tail. This is important especially with single wafer reactors. A pre-reaction space also reduces reactor design complexity and, thus, design and construction costs. The present invention is particularly suitable for dealing with situations where there is a flow of previous gas residuals from dead-ends and similar parts of the equipment during the pulsing of the purging gas. By means of the invention it is possible to shorten the time interval (i.e. the purging time) between successive precursor pulses.

DETAILED DESCRIPTION OF THE INVENTION

Figure 1:
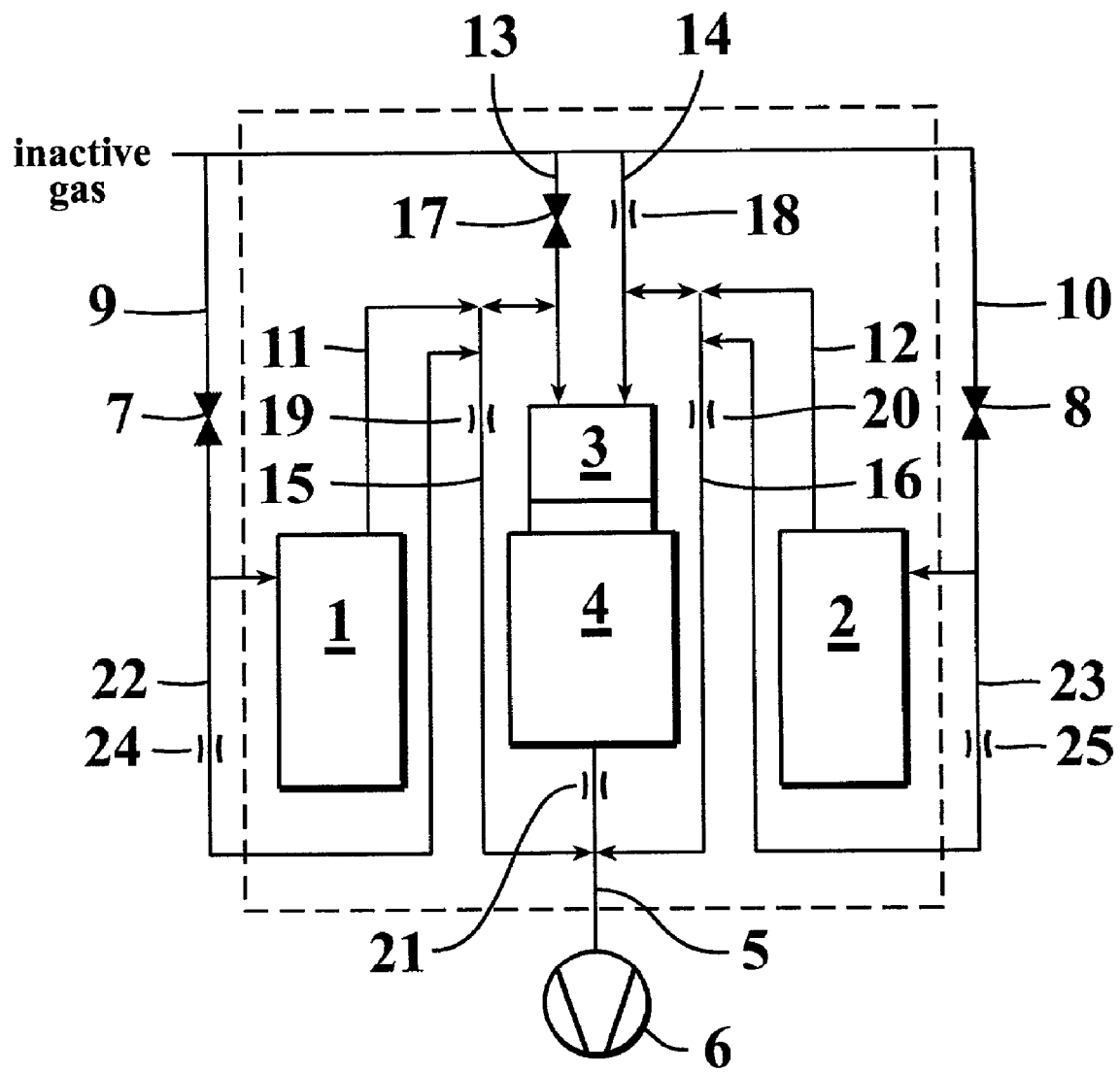
FIG. 1 shows the principal configuration of a process according to the present invention, comprising two reactant sources, a pre-reaction space and a reaction chamber.

The present invention provides a method of growing a thin film onto a substrate, in which method a substrate is placed in a reaction chamber and said substrate is subjected to surface reactions of a plurality of vapour-phase reactants according to the ALD method to form a thin film. The method comprises contacting a subsequent vapour-phase pulse with the residual components of the previous vapour-phase pulse so as to form a reaction product of the reactant of the subsequent vapour-phase pulse with the reactant of the previous vapour-phase pulse before feeding the subsequent vapour-phase pulse into the reaction chamber. Preferably, the subsequent vapour-phase pulse is reacted with the residual components of the previous vapour-phase pulse under conditions conducive to chemical vapour deposition to give rise to a solid product.

In the context of the present invention, the expression "conditions conducive to ALD growth" refers to conditions wherein the each vapor-phase reactant pulse is separately reacted with the surface of a substrate at a temperature in the range between the evaporation temperature of the reactant and the decomposition temperature of the evaporated reactant at the prevailing pressure.

"Conditions conducive to CVD growth" are conditions at which at least two reactants are simultaneously present in a gas space and capable of reacting with each other in the gas phase so as to form a solid reaction product which is deposited on a surface.

Herein, the term "substrate surface" is used to denote that top surface of the substrate on which the vapor-phase reactant flowing into the reaction chamber first impinges. In practice, said surface during the first cycle of the thin-film growing process is constituted by the surface of the substrate such as glass, for instance; during the second cycle the surface is constituted by the layer comprising the solid-state reaction product which is deposited by the reaction between the reactants and is adhered to the substrate, etc.

The "substrate" is any material on which the thin film is to be grown. Usually it comprises a planar sheet or plate of material which is capable of withstanding the temperature of the reaction without deformation. The planar substrate can have any shape, usually it is rectangular or circular. A traditional application of ALD is for growing electroluminescent (EL) thin film display units on rectangular glass substrates. Recently, the versatility of ALD for growing thin films on circular silicon wafers has been demonstrated. In addition to the actual substrate(s) on which the thin films are grown, according to a preferred embodiment of the present invention, a separate substrate is arranged in the pre-reaction space to allow for deposition of a solid product formed by the reaction between the reactant pulses in the gas phase. This substrate, which is discarded, can be and preferably is of the same material as the actual substrate(s).

In the present context, the term "inactive" gas is used to refer to a gas which is admitted into the reaction space and is capable of preventing undesired reactions related to the reactants and the substrate, respectively. In the method according to the invention, the inactive gas is also used advantageously as the carrier gas of the vapor-phase pulses of the reactants. Of inactive gases suited for use in the method, reference can be made to inert gases such as nitrogen gas and noble gases, e.g., argon. The inactive gas may also be an inherently reactive gas such as hydrogen gas serving to prevent undesirable reactions (e.g., oxidization reactions) from occurring on the substrate surface.

In the present context, the term "reactant" refers to a vaporizable material capable of reacting with the substrate surface. In the ALD method, reactants belonging to two different groups are conventionally employed. The reactants may be solids, liquids or gases. The term "metallic reactants" is used of metallic compounds which may even be elemental metals. Suitable metallic reactants are the halogenides of metals including chlorides and bromides, for instance, and organometallic compounds such as the thd complex compounds. As examples of metallic reactants may be mentioned Zn, $ZnCl_2$, $TiCl_4$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia. The term "precursor" is used synonymously with "reactant".

According to a particularly preferred embodiment, the present apparatus comprises a pre-reaction zone, in the following also called "a first reaction zone", upstream of the actual ALD reactor, in the following also called "the second reaction zone". In the first reaction zone, the subsequent vapour-phase pulse is reacted with the residual components of the previous gas phase pulse. The first reaction zone is in particular placed immediately adjacent to the second reaction zone and it is adapted to be freely communicating with the second reaction zone. In practice, it can be part of the reaction space/gas space of the reaction chamber. Thus, in this embodiment, the first and the second reaction zones are arranged one after the other inside the reaction chamber in such a way that any intermixing of reactant pulses takes place before the vapour-phase pulses alternately contact with the first actual substrate surface.

The reactants are fed into said reaction chamber each separately from its own source via a separate feed channel. The pre-reaction zone can be formed by interconnecting the feed channels upstream of the reaction chamber to form a gas space, in which a subsequent reactant pulse will meet the gas phase tail of the preceding reactant pulse to form a reaction product before the subsequent gas phase pulse is fed into the reaction chamber. The tail may contain unreacted precursor residues and impurities stemming from the reactant, impurities contained in the carrier gas or coming from the piping (e.g. the gaskets and packings). The residual components may also stem from residues of an earlier gas phase pulse of another thin film process using other reactants.

By virtue of the reaction, the residue of the preceding reactant will become chemically depleted and, thus, the residues are prevented from entering the reaction chamber simultaneously with the subsequent gas phase pulse.

The first reaction zone can be operated at any conditions which will give rise to the formation of a reaction product which can withdrawn separately from the actual thin film product. Preferably the pre-reaction zone is, however, operated at the same temperature as the second reaction zone.

According to a particularly preferred embodiment, the concentration of residual components of the previous vapour-phase pulse in the subsequent gas phase pulse is reduced to less than 1 ppm before the subsequent gas phase pulse is fed into the reaction chamber. The present process can be combined with the process of U.S. Pat. No. 6,015,590. Thus, by means of the prior process, the concentration of the residual components of the previous vapour-phase pulse is reduced by purging the reaction chamber and gas flow channels freely communicating with the reaction chamber. The purging step can be carried out by feeding inactive gas into the reaction chamber and into the gas flow channels while simultaneously evacuating the reaction chamber. In this way, the concentration of the residual components of the previous vapour-phase pulse in the first reaction zone can be first reduced to less than 1 vol-% before contacting said residual components with the subsequent vapour-phase pulse.

In summary, the present process is preferably carried out in an apparatus for growing thin films onto a substrate by ALD, comprising in combination a reaction chamber into which the substrate can be disposed;

a plurality of inlet channels communicating with said reaction chamber, said inlet channels being suited for feeding the reactants employed in a thin-film growth process in the form of vapour-phase pulses into said reaction chamber;

at least one outlet channel communicating with said reaction chamber, said outlet channel being suited for the outflow of reaction products and excess amounts of reactants from said reaction space; and a pre-reaction chamber arranged immediately upstream of the reaction chamber, said pre-reaction chamber forming a first reaction zone, in which the reactants of successive vapour-phase pulses can be reacted with each other in the vapour phase to form a solid product, whereas said reaction chamber forming a second reaction zone can be operated under conditions conducive to ALD growth of a thin film.

At least one, preferably all, of the gas feed channels are suited for feeding inactive gas into the reaction chamber.

According to a particularly preferred embodiment, which is also illustrated in the below example, the pre-reaction chamber and the reaction chamber is formed by a gas space comprising a plurality of substrates serially aligned in the gas flow direction of the vapour-phase pulses of the reactants, whereby the first substrate forms a surface suited for the growth of thin-film by chemical vapour deposition.

In this serial placement of substrates in the reactor, the flow path is built up by vertically stacked reaction spaces connected in series. By this arrangement the dominating point of gas flow restriction in the system will be the path covered by substrates, resulting in better homogenization of the gas flow over the substrates. Higher trough put of wafers/run and better uniformity of the thin film is also achieved.

Turning now to the embodiment shown in FIG. 1, it can be noted that the apparatus of that exemplifying embodiment comprises two sources, numbered 1 and 2, for reactants A and B, respectively, a pre-reaction space 3 and a reaction chamber 4. The reaction chamber outlet pipe 5 is provided with a flow restrictor 21 and connected to an evacuation pump 6. An inactive gas, such as nitrogen, is used both as a carrier gas for the reactant pulses and for purging the pre-reaction space and the reaction chamber between the reactant gas pulses. A valve 7, 8 is fitted into both of the conduits 9, 10 arranged between the source of inactive gas and the reactant sources 1, 2.

The reactant sources 1, 2 are further connected to the pre-reaction space 3 each by means of a conduit 11 and 12, respectively, which joins the feed lines 13, 14 of inactive gas at a point before the pre-reaction space 3. Both conduits 11 and 12 are connected to the outlet pipe of the reaction chamber via an open conduit 15, 16.

There is a filter incorporated into conduits 11 and 12 at a point between the reactant sources and the connection points of conduits 15, 16.

The feed lines 13, 14 are provided with valves 17, 18 and the conduits 15, 16 with flow restrictions 19, 20 for directing the reactant gas flow into the pre-reaction space and the reaction chamber rather than into the by-passing draining conduits 15, 16 during reactant pulsing.

The carrier gas conduits 9, 10 are both connected to the draining conduits 15, 16 by means of a by-passing conduit (the "fourth" conduit) 22, 23, which are connected to the draining conduits above the flow restrictions 19, 20. The flow is restricted with a capillar 24, 25.

As indicated by the dashed lines, the reactant sources 1, 2, the pre-reaction space 3 and the reaction chamber 4 and the conduits interconnecting them defines a hot zone within which the temperature is the same as the evaporation temperature of the reactants or higher (i.e. the "hot zone"). Depending on the precursors, typically the temperature is in the range of 25 to 500° C., in particular about 50 to 450° C. The pressure in the reaction chamber and in the gas flow channels freely communicating with the reaction chamber can be atmospheric but it is preferred to operate at reduced pressure, in particular at a pressure in the range of 1 to 100 mbar.

The apparatus is operated as follows: There is a constant flow of gas from the source of inactive gas. When valve 7 is opened, feed lines 13 and 14 are closed with valves 17 and 18. The inactive gas therefore flows through the reactant source (or through the gas space in intimate contact with the reactant material. Thus, there is a flow of precursor A in a carrier gas from the reactant source 1 into the pre-reaction space 3 and the reaction chamber 4. There is also a flow of inactive gas through conduit 22. The inactive gas thus introduced into conduit 15 will form a barrier to the flow of precursor vapours into the draining conduit. When valve 7 is closed and line 13 opened, there is formed a gas phase barrier in the reactant gas line 11 because there is an opposite directed flow of inactive gas from gas line 13 through the part of the gas line 11 which lies between gas line 13 and conduit 15. The reaction space is flushed by the inactive gas fed via line 13.

After flushing there may still remain a weakly bonded residual tail of precursor A on system gas channel surfaces, in particular on the surface of gas line 13 and in the pre-reaction space. When valve 8 is opened and feed lines 13 and 14 closed, precursor B flows into the pre-reaction space 3 and bonds precursor A residuals on the pre-reaction space surface before precursor B continues into the reaction chamber 4. Thus, there is a chemical purge of precursor tails. When the reactants A and B meet in the pre-reaction space, CVD growth will take place. The solid reaction product of the pre-reaction space 3 is removed separately from the ALD grown thin film in the reaction chamber 4. According to a particularly preferred embodiment, the reaction product is deposited on a discardable substrate. The reaction product can, however, also be formed on the inner walls of the apparatus defining the pre-reaction reaction space, whereby the reaction product is removed by cleaning or cleansing the walls.

The reactant sources 1, 2 are further connected to the pre-reaction space 3 each by means of a conduit 11 and 12, respectively, which joins the feed lines 13, 14 of inactive gas at a point before the pre-reaction space 3. Both conduits 11 and 12 are connected to the outlet pipe of the reaction chamber via an open conduit 15, 16.

The feed lines 13, 14 are provided with valves 17, 18 and the conduits 15, 16 with flow restrictors 19, 20 for directing the reactant gas flow into the pre-reaction space and the reaction chamber rather than into the by-passing conduits 15, 16 during reactant pulsing.

As indicated by the dashed lines, the reactant sources 1, 2, the pre-reaction space 3 and the reaction chamber 4 and the conduits interconnecting them defines a hot zone within which the temperature is the same as the evaporation temperature of the reactants or higher (i.e. the "hot zone"). Depending on the precursors, typically the temperature is in the range of 25 to 500° C., in particular about 50 to 450° C. The pressure in the reaction chamber and in the gas flow channels freely communicating with the reaction chamber can be atmospheric but it is preferred to operate at reduced pressure, in particular at a pressure in the range of 1 to 100 mbar.

The apparatus is operated as follows: There is a constant flow of gas from the source of inactive gas. When valve 7 is opened, feed lines 13 and 14 are closed with valves 17 and 18. The inactive gas therefore flows through the reactant source (or through the gas space in intimate contact with the reactant material. Thus, there is a flow of precursor A in a carrier gas from the reactant source 1 into the pre-reaction space 3 and the reaction chamber 4. When valve 7 is closed and line 13 opened, there is formed a gas phase barrier in the reactant gas line 11 because there is an opposite directed flow of inactive gas from gas line 13 through the part of the gas line 11 which lies between gas line 13 and conduit 15. The reaction space is flushed by the inactive gas fed via line 13.

After flushing there may still remain a weakly bonded residual tail of precursor A on system gas channel surfaces, in particular on the surface of gas line 13 and in the pre-reaction space. When valve 8 is opened and feed lines 13 and 14 closed, precursor B flows into the pre-reaction space 3 and bonds precursor A residuals on the pre-reaction space surface before precursor B continues into the reaction chamber 4. Thus, there is a chemical purge of precursor tails. When the reactants A and B meet in the pre-reaction space, CVD growth will take place. The solid reaction product of the pre-reaction space 3 is removed separately from the ALD grown thin film in the reaction chamber 4. According to a particularly preferred embodiment, the reaction product is deposited on a discardable substrate. The reaction product can, however, also be formed on the inner walls of the apparatus defining the pre-reaction reaction space, whereby the reaction product is removed by cleaning or cleansing the walls.

Figure 2:
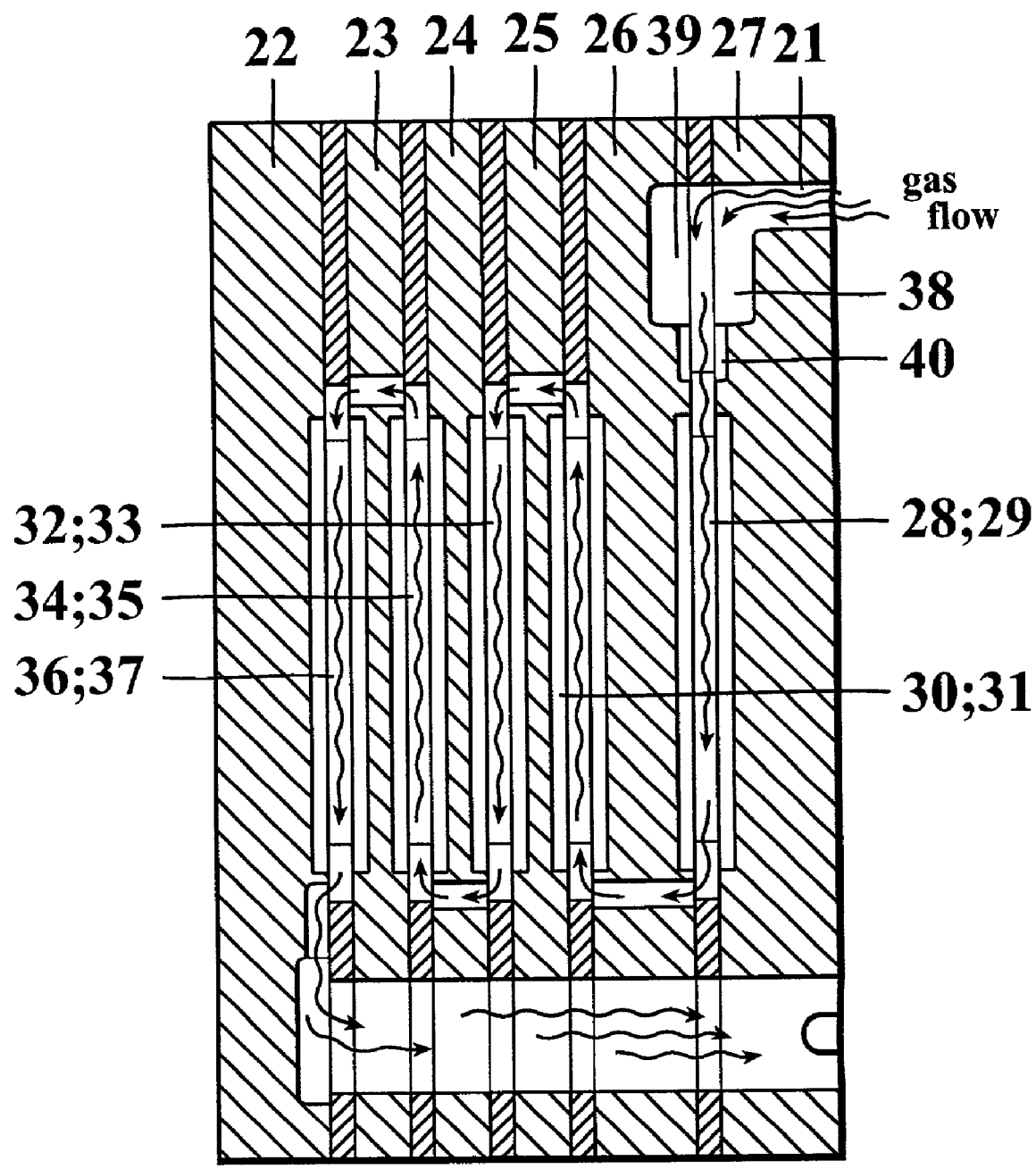
FIG. 2 shows a side section of a preferred embodiment of the invention.

EXAMPLE $TiO_2$ films were grown from $TiCl_4$ and $H_2O$ on glass substrates in a reaction space having the structure shown in FIG. 2. The reaction space comprised gas flow channels 21 formed in a reactor block consisting of a plurality of reaction chamber parts or elements 22-27 which were stacked or rather fitted adjacent to each other. The reaction chamber parts can be manufactured from metal or quartz, as in the present case. The glass substrates 28–38 were placed in recesses formed between adjacent reactor parts. In each recess, there were two substrates facing each other, one on each side of a central opening. The substrate pair formed the surfaces which the gas flow was contacted with in the recess and on which a thin film was grown. Five pairs of substrates 28–37 were arranged in a serial arrangement to form a cascade. The reactant pulses were fed into the reaction space from two separate gas flow channels 38, 39. The gas flow of one of the reactants is shown by the arrow-headed line drawn up in the figure.

There was a non-uniform area of thin film growth at the front side of the first pair of glass substrates 28, 29. When the reactants were fed from opposite sides, the purge of the gas channels 38, 39 and the spreading chamber 40 in-between the reactant pulses took most of the excess material away, but there remained a tail of the preceding pulse. As a result, the conditions at the first pair of substrates are conducive to film growth by chemical vapour deposition (both reactants are available in the gas phase simultaneously. The reactants therefore reacted with each other in the gas phase and a solid product was deposited on the substrates, in particular at the front end of them. These substrates were discarded after the growth process reaction. Whereas the first pair of glasses took up the disturbed growth, the following glasses were uniform from the very front edge.

A further advantage of the serial arrangement of the substrates is that the flow becames very homogeneous.

What is claimed is:

1. A method for growing a thin film on a surface of a substrate in a reactor according to the ALD method, said method comprising:
    providing a first conduit for delivering a pulse of a first vapor phase reactant and a second conduit for delivering a pulse of a second vapor phase reactant to said reactor;
    providing at least a first substrate in a pre-reaction chamber that is defined by a plurality of walls and a second substrate in a reaction chamber, said first substrate being positioned downstream of a point in the pre-reaction chamber where both said first and said second phase reactants have entered the pre-reaction chamber and said pre-reaction chamber being aligned downstream with said reaction chamber and having a single outlet that is directly connected with said reaction chamber, and said first substrate being a separate element from the walls of the pro-reaction chamber;
    feeding the pulse of the first vapor phase reactant into said pre-reaction chamber and over the first substrate and subsequently into said reaction chamber and over the second substrate;
    reacting the first vapor phase reactant with said surface of said first substrate and subsequently, with a surface of said second substrate to form a thin film on said first and second substrates, wherein residual first vapor phase reactant remains in said pre-reaction chamber; and
    feeding a pulse of a second vapor phase reactant into said reactor, wherein said second vapor phase reactant reacts with said residual first vapor phase reactant to form a solid reaction product in said pre-reaction chamber on said first substrate and said second vapor phase reactant subsequently reacts with said surface of said second substrate in said reaction chamber.

2. The method of claim 1, wherein said residual first vapor phase reactant is in the gas phase.

3. The method of claim 1, wherein said residual first vapor phase reactant is adsorbed on the walls of the reaction chamber.

4. The method of claim 1, wherein said reaction chamber comprises a pre-reaction chamber in which the first substrate is positioned and a second reaction chamber in which the second substrate is positioned, wherein said pre-reaction chamber is upstream of said second reaction chamber.

5. The method of claim 4, wherein said second reaction chamber is operated under conditions conducive to ALD.

6. The method of claim 4, wherein said residual first vapor phase reactant is present in said pre-reaction chamber.

7. The method of claim 4, wherein said reaction product is formed in said pre-reaction chamber.

8. The method of claim 4, wherein said pre-reactor is placed immediately adjacent to the said second reaction chamber and it is adapted to be freely communicating with the second reaction chamber.

9. The method of claim 4, wherein said pre-reactor is opened under conditions conducive to chemical vapor deposition so as to form said solid reaction product.

10. The method of claim 4, wherein said second vapor phase reactant is reacted with the residual first vapor phase reactant to form said solid reaction product so as to deplete the residual first vapor phase reactant, thereby preventing said residual first vapor phase reactant from entering said second reaction chamber.

11. The method of claim 4, wherein the pre-reactor is operated at the same temperature as the second reactor.

12. The method of claim 4, wherein the reaction product is formed on the inner walls of the pre-reactor, and the reaction product is removed horn the pre-reactor by cleaning the walls.

13. The method of claim 4, wherein a concentration of said residual first vapor phase reactant in said pre-reactor is reduced to less than I ppm by reacting said residual first vapor phase reactant with said second vapor phase reactant.

14. The method of claim 4, wherein a concentration of said residual first vapor phase reactant in said pre-reactor is reduced to a concentration of less than 1 vol-% by reacting said residual first vapor phase reactant with said second vapor phase reactant.

15. The method of claim 1, further comprising repeatedly alternately feeding at least said first vapor phase reactant and said second vapor phase reactant.

16. The method of claim 1, further comprising feeding a plurality of vapor phase reactants into said reactor.

17. The method of claim 1, wherein said second vapor phase reactant reacts with said residual first vapor phase reactant under conditions conducive to chemical vapor deposition.

18. The method of claim 1, further comprising feeding an inactive gas into said reactor after feeding said first vapor phase reactant or said second vapor phase reactant.

19. The method of claim 18, further comprising evacuating said reaction chamber while (ceding said inactive gas.

20. The method of claim 1, wherein a pressure in said reaction chamber is in the range of 1 to 100 mbar.

* * * * *

UNITED STATES PATENT AND TRADEMARK OFFICE
CERTIFICATE OF CORRECTION

PATENT NO. : 7,105,054 B2  
APPLICATION NO. : 09/836674  
DATED : September 12, 2006  
INVENTOR(S) : Sven Lindfors Page 1 of 1

It is certified that error appears in the above-identified patent and that said Letters Patent is hereby corrected as shown below:

In Column 9, Line 36, in Claim 1, delete "pre-reaction" and insert --pre-reaction--, therefor.

In Column 9, Line 42, in Claim 1, delete "subsequently," and insert --subsequently--, therefor.

In Column 10, Line 17, in Claim 9, delete "opened" and insert --operated--, therefor.

In Column 10, Line 29, in Claim 12, delete "horn" and insert --from--, therefor.

In Column 10, Line 33, in Claim 13, delete "I" and insert --1--, therefor.

In Column 10, Line 54, in Claim 19, delete "(ceding" and insert --feeding--, therefor.

Signed and Sealed this

Tenth Day of April, 2007

JON W. DUDAS  
*Director of the United States Patent and Trademark Office*